(12) United States Patent
Madane et al.

(10) Patent No.: US 11,243,269 B2
(45) Date of Patent: Feb. 8, 2022

(54) SYSTEM AND METHOD FOR SPOOL FAULT DETECTION OF SOLENOID VALVES USING ELECTRICAL SIGNATURE

(71) Applicant: DANFOSS POWER SOLUTIONS II TECHNOLOGY A/S, Nordborg (DK)

(72) Inventors: Mayura Arun Madane, Pune (IN); Nilesh Surase, Pune (IN); Prachi Zambare, Pune (IN); Shruti Zapdekar, Maharshtra (IN); Samuel Lazarus, Pune (IN); Anil Ghegade, Pune (IN); Marco Bison, Bedano (CH); Ananda Pasala, Karnataka (IN)

(73) Assignee: DANFOSS POWER SOLUTIONS II TECHNOLOGY A/S, Nordborg (DK)

( * ) Notice: Subject to any disclaimer, the term of this patent is extended or adjusted under 35 U.S.C. 154(b) by 107 days.

(21) Appl. No.: 16/557,590

(22) Filed: Aug. 30, 2019

(65) Prior Publication Data
US 2020/0072892 A1   Mar. 5, 2020

(30) Foreign Application Priority Data
Aug. 31, 2018   (IN) .............................. 201811032736

(51) Int. Cl.
*G01R 31/72* (2020.01)
*G01R 31/28* (2006.01)
*F16K 31/06* (2006.01)
*H01F 7/18* (2006.01)

(52) U.S. Cl.
CPC .......... *G01R 31/72* (2020.01); *F16K 31/0675* (2013.01); *G01R 31/2829* (2013.01); *H01F 7/1844* (2013.01)

(58) Field of Classification Search
CPC . G01R 31/72; G01R 31/2829; F16K 31/0675; H01F 7/1844
See application file for complete search history.

(56) References Cited

U.S. PATENT DOCUMENTS

| | | | |
|---|---|---|---|
| 5,153,522 A * | 10/1992 | Sano | ....................... F16H 61/28 324/546 |
| 8,925,566 B2 | 1/2015 | Haller | |
| 9,222,242 B2 | 12/2015 | Yuan et al. | |
| 9,329,099 B2 | 5/2016 | Long et al. | |
| 2016/0125993 A1* | 5/2016 | Narayanasamy | ..... H01F 7/1844 361/160 |

FOREIGN PATENT DOCUMENTS

| | | |
|---|---|---|
| CN | 103336189 A | 10/2013 |
| EP | 2551684 B1 | 9/2014 |
| EP | 2844857 B1 | 7/2019 |

* cited by examiner

*Primary Examiner* — Noam Reisner
(74) *Attorney, Agent, or Firm* — Merchant & Gould P.C.

(57) ABSTRACT

The present disclosure relates to a system for monitoring a solenoid operated valve including at least one coil and at least one spool. The system compares a normalized current signature and a normalized current signature comparator to determine a spool fault condition.

18 Claims, 13 Drawing Sheets

Selected Current Profile with Ideal Line a) Spool Healthy Condition Full Stroke; b) Spool Stuck Condition Example positive spool fault current signature Example negative spool fault current signature Selected Current Profile with Ideal Line a) Spool Healthy Condition Full Stroke; b) Spool Stuck Condition

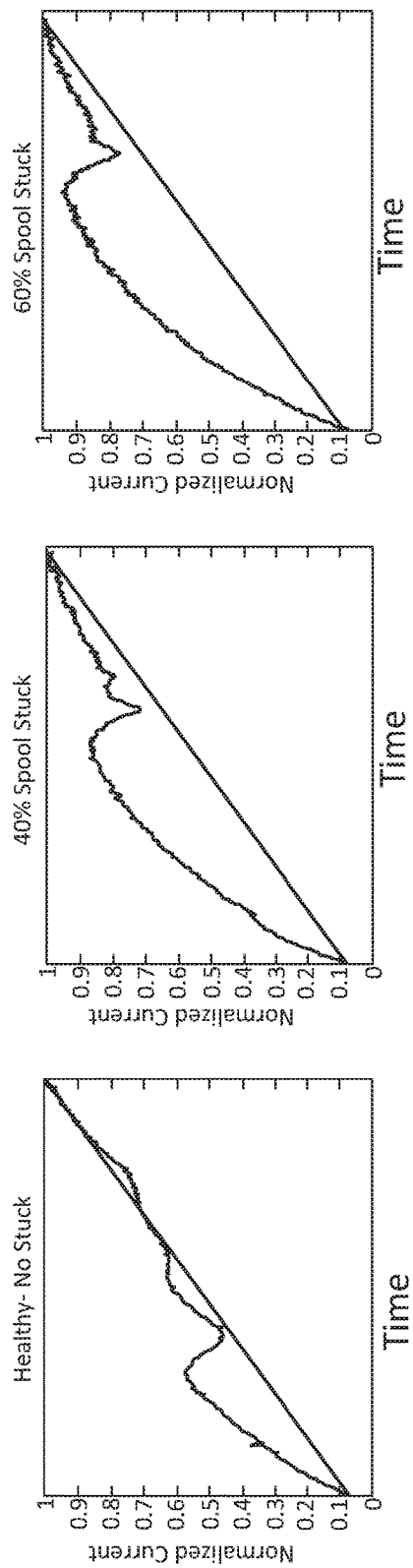
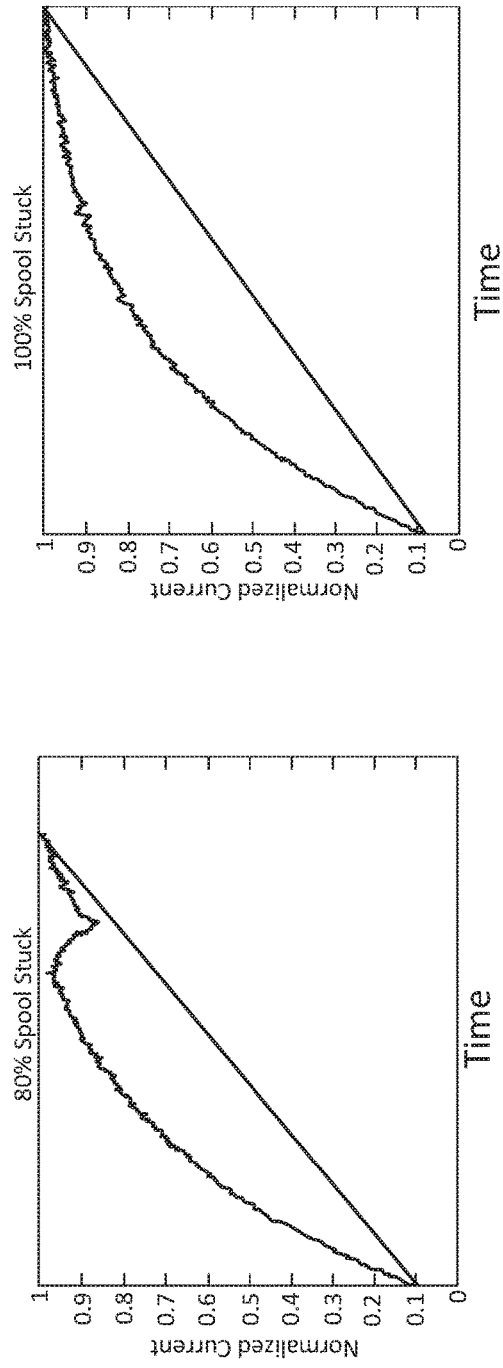
FIG. 10A  FIG. 10B  FIG. 10C  FIG. 10D  FIG. 10E

SYSTEM AND METHOD FOR SPOOL FAULT DETECTION OF SOLENOID VALVES USING ELECTRICAL SIGNATURE

CROSS-REFERENCE TO RELATED APPLICATION

The present application claims priority to Indian Provisional Patent Application Serial No. 201811032736, filed Aug. 31, 2018, entitled "System and Method for Spool Fault Detection of Solenoid Valves using Electrical Signature." The subject matter disclosed in that provisional application is hereby expressly incorporated into the present application in its entirety.

BACKGROUND

Many fluid power systems, such as hydraulic systems, include valves to regulate fluid flow. There are various type of valves used for various purposes such as direction control, pressure control, on/off flow control, and proportional flow control. Valves are used in different machines used in various industrial and mobile applications including injection molding machines, high pressure processing machines, lathe machines and mobile machines. The number of valves used in a given machine can vary greatly.

Some fluid power systems include spool valves, where the regulating member is one or more lands of a spool that moves within a flow passage. In some systems, the regulating member is driven by a solenoid linear actuator. It is not uncommon for a single system to include up to 50 or more valves.

In example systems, the multiple values are connected in series or parallel combinations. Failure of even a single valve can prevent the entire system from working. Failure of the values can occur due to valve blockage related to spool faults resulting in issues such as lack of pressure or lack of intended cylinder displacement. Two common types of spool faults arise from the spool being stuck completely and does not move, or the spool having reduced or restricted movement. Some common causes for spool faults are contamination of the fluid or wear of parts.

Failure of a valve can lead to many problems that require time and money to repair. Failures of valves due to spool faults may be avoided if the spool faults can be detected and localized. Traditional monitoring methods include monitoring peaks and valleys of the current of a solenoid valve, recording a time corresponding to each of the peaks and valleys, comparing the current signature with a historical profile of the solenoid valve current, and using additional sensors for sensing spool position. Other methods include using coil inductance and resistance equivalent to coil current and comparing operating voltages with a preset threshold. However, noise in the current of a solenoid valve due to variations in operating conditions such as voltage, temperature, the integrity of the solenoid coil, and flow and pressure variations of the liquid make using traditional monitoring methods difficult or inaccurate.

SUMMARY

In general terms, the present disclosure is directed to systems and methods that provide for cost-effective and/or otherwise improved solenoid-valve diagnostics. More particularly, systems and methods for detection of a spool fault condition for solenoid operated valves is disclosed.

In one aspect is a system for monitoring the spool of a solenoid operated valve comprising: a solenoid operated valve comprising at least one coil and at least one spool; a current sensing circuit to measure a current signature of the coil upon actuating the solenoid operated valve; and a processor and a memory in electronic communication with the processor for executing a spool fault detection algorithm operable to: determine a normalized current signature from the current signature measured by the current sensing circuit; determine a normalized current signature comparator; and compare the normalized current signature and the normalized current signature comparator to determine a spool fault condition.

Another aspect is a method of detecting a solenoid valve spool fault, comprising: measuring a current signature of a solenoid coil upon actuating a solenoid valve; determining a normalized current signature from the measured current signature; determining a normalized current signature comparator; determining whether at least one intersection point between the normalized current signature and the normalized current signature comparator exists; determining at least one negative area from the difference of the normalized current signature comparator from the normalized current signature; determining a value of a membership function based on the at least one negative area; and determining a spool fault condition based on whether the at least one intersection point exists, the at least one negative area, and the value of the membership function.

BRIEF DESCRIPTION OF THE DRAWINGS

The present disclosure will be described hereafter with reference to the attached drawings which are given as non-limiting examples only, in which:

FIGS. 10A-E are plots illustrating current signatures for various partial spool stroke lengths achieved in response to a control or command signal.

DETAILED DESCRIPTION

Figure 1:
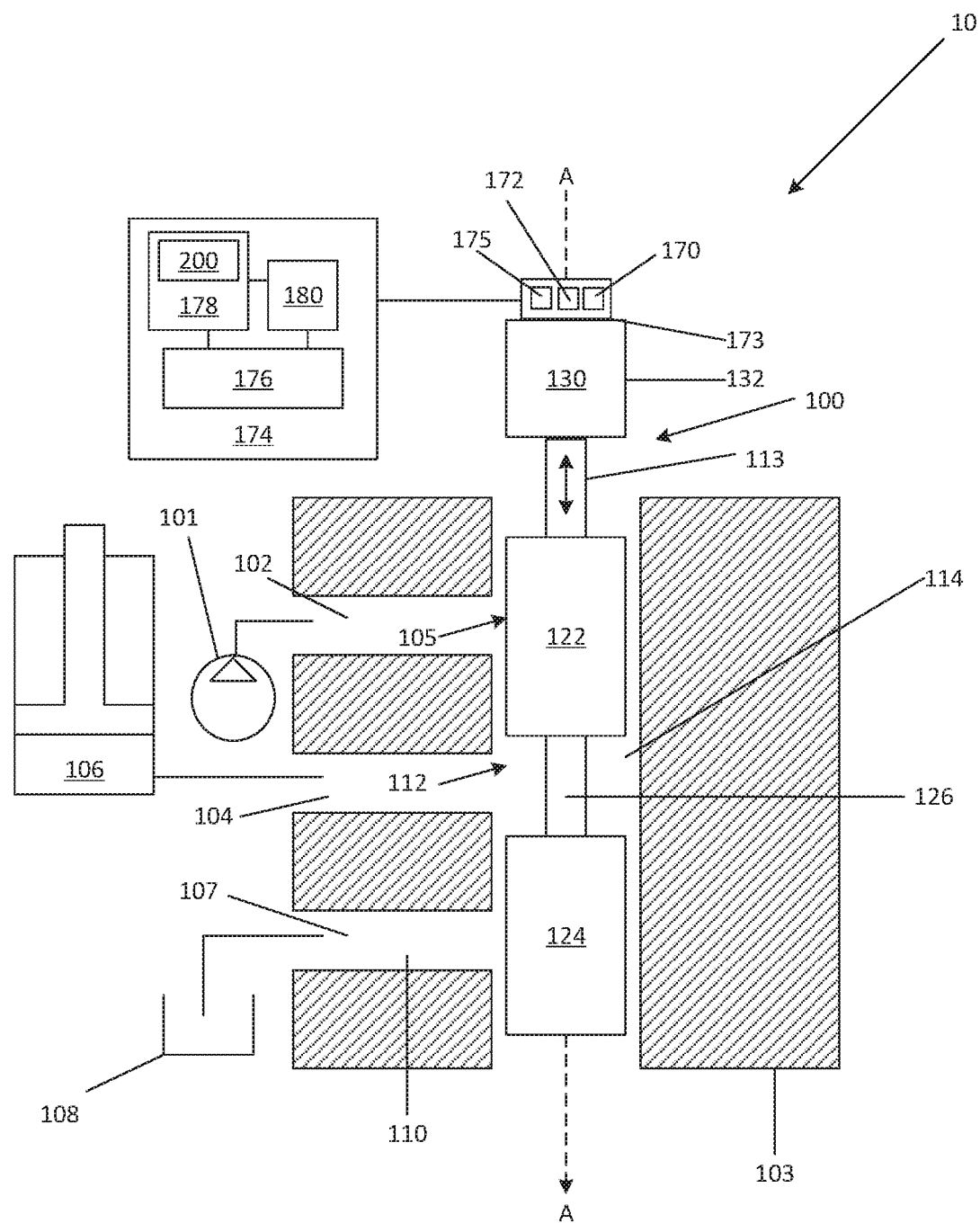
FIG. 1 is a schematic illustration of an example system including a valve assembly according to the present disclosure.

Various embodiments will be described in detail with reference to the drawings, wherein like reference numerals represent like parts and assemblies throughout the several views. Reference to various embodiments does not limit the scope of the claims attached hereto. Additionally, any examples set forth in this specification are not intended to be limiting and merely set forth some of the many possible embodiments for the appended claims.

References in the specification to "one embodiment," "an embodiment," "an illustrative embodiment," etc., indicate that the embodiment described may include a particular feature, structure, or characteristic, but every embodiment may or may not necessarily include that particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

In the drawings, some structural or method features may be shown in specific arrangements and/or orderings. However, it should be appreciated that such specific arrangements and/or orderings may not be required. Rather, in some embodiments, such features may be arranged in a different manner and/or order than shown in the illustrative figures. Additionally, the inclusion of a structural or method feature in a particular figure is not meant to imply that such feature is required in all embodiments and, in some embodiments, may not be included or may be combined with other features.

When valves of a mechanical system deteriorate or wear out, the position of flow or pressure regulating members of those valves, such as the spool of a solenoid operated valve, can deviate from the position that is expected from an operating command. The result of such a position deviation can be too much or too little flow, or an undesirable pressure differential across the valve, etc. Such abnormal spool operation can be caused by contamination of the fluid or wear of the parts of the valve. It is therefore beneficial to detect such deviations during operation of the system so that command inputs can be adjusted to achieve the desired flow/pressure, and also to prevent against system failure and consequences thereof, such as breakdown of the machinery/equipment.

In general terms, this disclosure is directed to monitoring the spool of a solenoid operated valve. In some embodiments, and by non-limiting example, a system and method for monitoring the spool of a solenoid operated valve includes a solenoid coil and spool. In some embodiments the systems and methods incorporate an electrical current meter and a processor and a memory in electronic communication with the processor for executing a spool fault detection algorithm.

In typical hydraulic spool valve assemblies, spool position is detected using a linear variable differential transformer (LVDT) coupled directly to the spool. However, LVDT's are expensive and can be damaged over time by being subjected to the high pressure hydraulic fluid in the flow passage in which they are positioned. The system and methods of monitoring the spool of a solenoid operated valve of this disclosure may be implemented without direct measurement of spool position or the need for extra sensors such as LVDTs, but rather infer spool position from measurements of other measured parameters of the valve, e.g. measured solenoid coil current. In addition, the systems and methods disclosed herein may be performed "in real time," where detection may be reported near-instantaneously and concurrently allowing for continuous monitoring with little appreciable delay between detection and reported results.

FIG. 1 represents a mechanical system 10 that at least partially operates through the use of hydraulics. The hydraulics include a non-limiting embodiment of valve assembly 100 used to illustrate principles of the present disclosure. In some examples, the valve assembly 100 is a flow metering valve, e.g. a proportional flow control valve. The valve assembly 100 includes a housing 103 housing a spool 112 mounted in a spool bore 114 defined by the housing 103. In this example, the spool valve is a three-way spool valve. However, the principles of the present disclosure are readily applied to other spool valves (e.g., two-way spool valves) and other fluid control valves, e.g. on-off valves, directional control valves, pressure control valves, and flow control valves with on/off or proportional operation. The spool 112 includes a shaft 126 coupled to a pair of metering lands 122 and 124 on either end of the shaft 126, each land being a regulating member (e.g., a fluid flow and/or fluid pressure regulating member) of the valve assembly 100. A solenoid linear actuator 130 is coupled to the spool 112 and is adapted to drive axial linear movement of the spool 112 within the spool bore 114, the linear movement being along the central axis A of the spool bore 114. Solenoid linear actuator 130 houses a coil 132, or coils 132, which is used to generate a controlled magnetic field by the application of a control or command signal that generates a current in the coil 132. In some embodiments, the solenoid linear actuator 130 also houses a ferromagnetic core positioned within the coil 132.

A fluid supply 101 (e.g., a pump) supplies hydraulic fluid via a supply line 102 through a supply port 105 to a work port 104. The work port 104 is connected to a hydraulic cylinder 106 that drives a load, i.e., a load of a piece of hydraulic equipment or machinery. Fluid from the work port empties to the tank 108 via a tank port 107 and a tank line 110.

In certain examples, the mechanical system 10 maintains a constant or controlled pressure differential across the valve. In other examples, position of the spool 112 in combination with sensed pressure differential can be used to estimate flow rate through the ports.

A control unit 170 is configured to provide control or command signals that generate current in the coil 132 to drive axial linear movement of the regulating members and 124 along the axis A. The control unit also includes an electrical current meter 173, e.g., an ammeter, adapted to measure electrical current in the coil or coils 132 of the solenoid linear actuator 130. The control unit 170 is in a fixed position relative to the coil or coils of the solenoid linear actuator 130. The control unit 170 is positioned outside the spool bore 114 and any hydraulic flow passage, and so is not exposed to hydraulic pressure generated by the mechanical system 10.

Measurements from the electrical current meter 173 are fed to an operating subsystem 174 of the mechanical system 10, the operating subsystem 174 being operatively coupled to the control unit 170. The operating subsystem 174 includes one or more processors 180 adapted to execute computer readable instructions and to process signals received from the control unit. The operating subsystem 174 also includes a memory 178 that stores computer readable instructions and a command interface 176, both operatively coupled to the one or more processors 180.

The solenoid linear actuator 130 can receive an electrical current to drive axial linear movement of the spool 112 along the axis A to a position in proportion to the received electrical current, for example, such as in a proportional solenoid valve. As the solenoid linear actuator 130 receives electrical current to drive axial linear movement of the spool 112 relative to the supply port 105 along the axis A, a portion 113 of the spool 112 or a portion of a spool assembly that includes the spool 112 and is fixedly coupled to the spool 112 moves relative to the one or more coils of the solenoid linear actuator 130, causing the magnetic flux through the coil or coils 132 to change, which likewise generates an inductance in the coil or coils. The inductance generated in the coils due to these magnetic field interactions with the spool 112 or portion 113 causes the current in the coil or coils 132 to change. The current in the coil or coils 132 is different depending on whether the spool 112 actually moved, did not move, or only partially moved. The current in the coil or coils 132 may be measured by the electrical current meter 173 as a function of time. Such measurements of the current in the coil or coils 132 may be visualized as a plot of coil current as a function of time over a period of time and referred to as a "current signature." Example current signatures are shown in FIGS. 2A and 2B below.

A spool fault condition may be generated by the control unit 170 to indicate whether the spool 112 moved normally, e.g. as expected and intended, in response to a control or command signal. In cases where the spool 112 moves normally through its full stroke length in response to the control or command signal, the control unit may indicate a negative spool fault condition, that is, there is no spool fault. In cases where the spool 112 does not move normally in response to the control or command signal, the control unit 170 may indicate a positive spool fault condition, that is, there is a spool fault. When the spool 112 does not move normally, it may move partially through its intended stroke length in response to the control or command signal, or it may not move at all, and the resulting spool fault condition indicated by the control unit 170 may also indicate whether the spool 112 moved at all and how much it moved. The spool fault condition reported by control unit 170, whether negative or positive and what type of positive spool fault (e.g. no movement at all or partial movement) is based on the current signature measured by the electrical current meter 173.

Figure 2B:
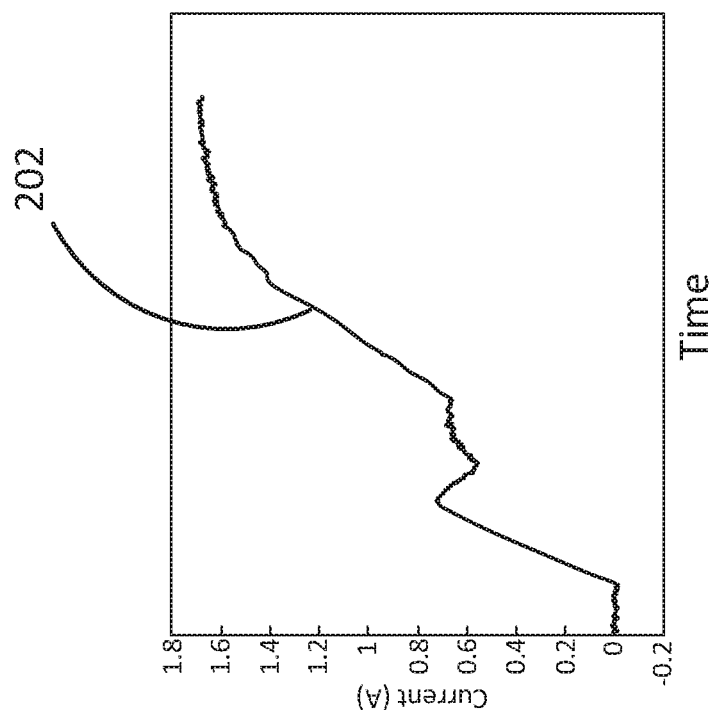
FIGS. 2A and 2B are plots illustrating current signatures of the solenoid coil.
Figure 2A:
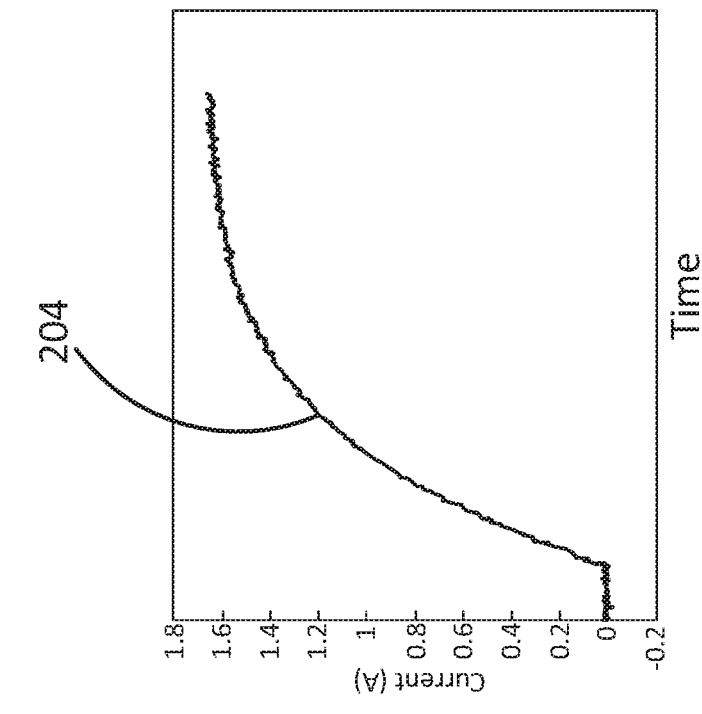

FIGS. 2A and 2B are plots illustrating current signatures corresponding to a negative spool fault condition and a positive spool fault condition, respectively. In the example shown in FIG. 2A, the electrical current meter 173 measures a current signature 202 in response to a control or command signal applied to the coil 132. Current signature 202 is an example of a current signature corresponding to a negative spool fault condition. In the example shown in FIG. 2B, the electrical current meter 173 measures a current signature 204 in response to a control or command signal applied to the coil 132. Current signature 204 is an example of a current signature corresponding to a positive spool fault condition.

Traditional monitoring methods may utilize measurements of coil current, and compare historical current signature measurements to determine if there is a spool fault. However, a current signature may change due to other causes besides a spool fault, such as variation in input voltage, temperature, the integrity of the coils of the solenoid, and flow and pressure conditions. There will therefore be ambiguity as to whether a change in the current signature is due to a spool fault or variation of some other cause.

Figures 3A, 3B:
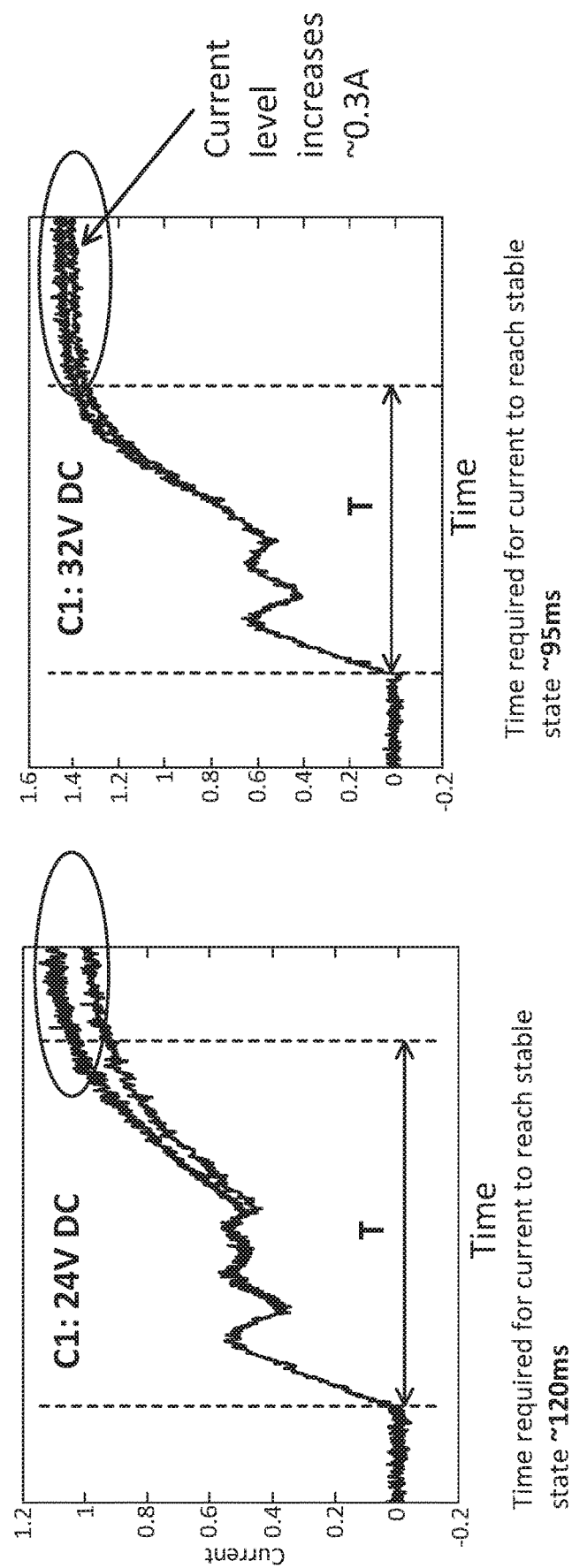
FIGS. 3A and 3B are plots illustrating current signature variation due to a change in input voltage.

FIGS. 3A and 3B are plots illustrating current signature variation due to a change in input voltage for cases where it is known that there is no spool default condition. Both the magnitude of the current of the current signature and the time required for the current to reach a stable state change. In FIG. 3A, the input voltage is 24 volts DC, and the circled portion illustrates the variation in current signature from multiple trials at the same 24 volt input voltage. In FIG. 3B, the input voltage is 32 volts DC, and the circled portion illustrates the variation in current signature from multiple trials at the same 32 volt input voltage. In comparing FIGS. 3A and 3B, not only do current signatures arising from the same input voltage vary, but also the current signatures from these different input voltages varies in magnitude and time T to reach a stable state.

Figure 4C:
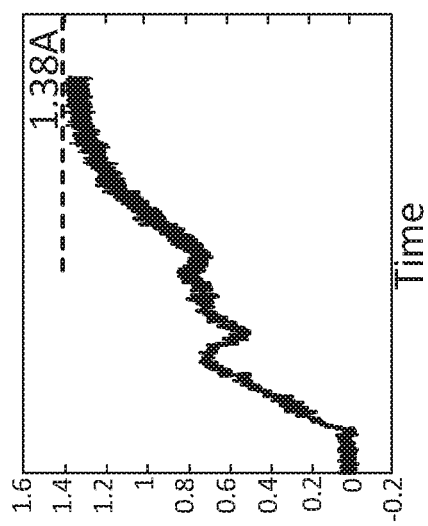
FIGS. 4A, 4B, and 4C are plots illustrating current signature variation due to ambient temperature change.
Figure 4B:
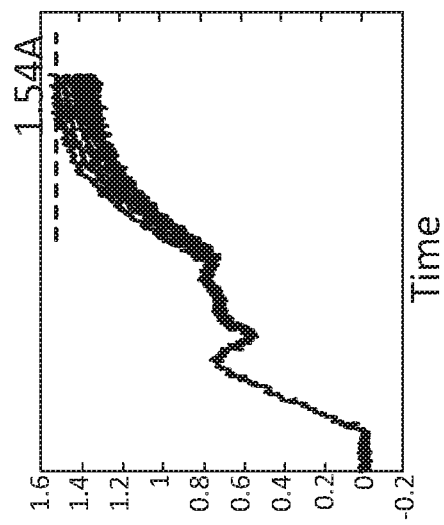
Figure 4A:
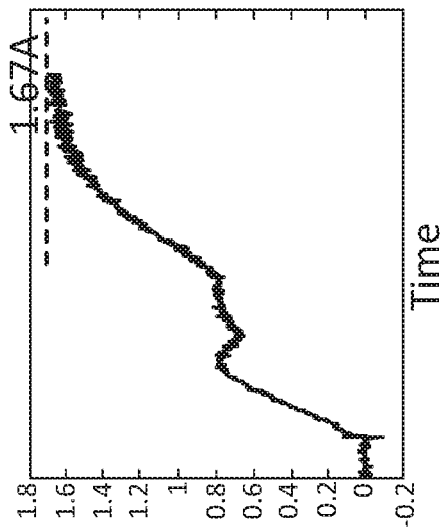

Similarly, FIGS. 4A, 4B, and 4C are plots illustrating current signature variation due to ambient temperature change for cases where it is known that there is no spool default condition. FIG. 4A, shows the variation in current signature from multiple trials of a valve in a temperature chamber holding the ambient temperature to zero degrees Celsius. FIG. 4B, shows the variation in current signature from multiple trials of a valve in a temperature chamber holding the ambient temperature to 25 degrees Celsius. FIG. 4C, shows the variation in current signature from multiple trials of a valve in a temperature chamber holding the ambient temperature to 55 degrees Celsius. In comparing FIGS. 4A-4C, not only do current signatures arising from valve operation at the same ambient temperature vary, but also the magnitude of the current signatures from these different ambient temperatures varies. In each of FIGS. 4A-4C, the command voltage for generating the driving current for each of the trials is the same, e.g., the variations in current signature illustrated are due to temperature differences.

Figure 5:
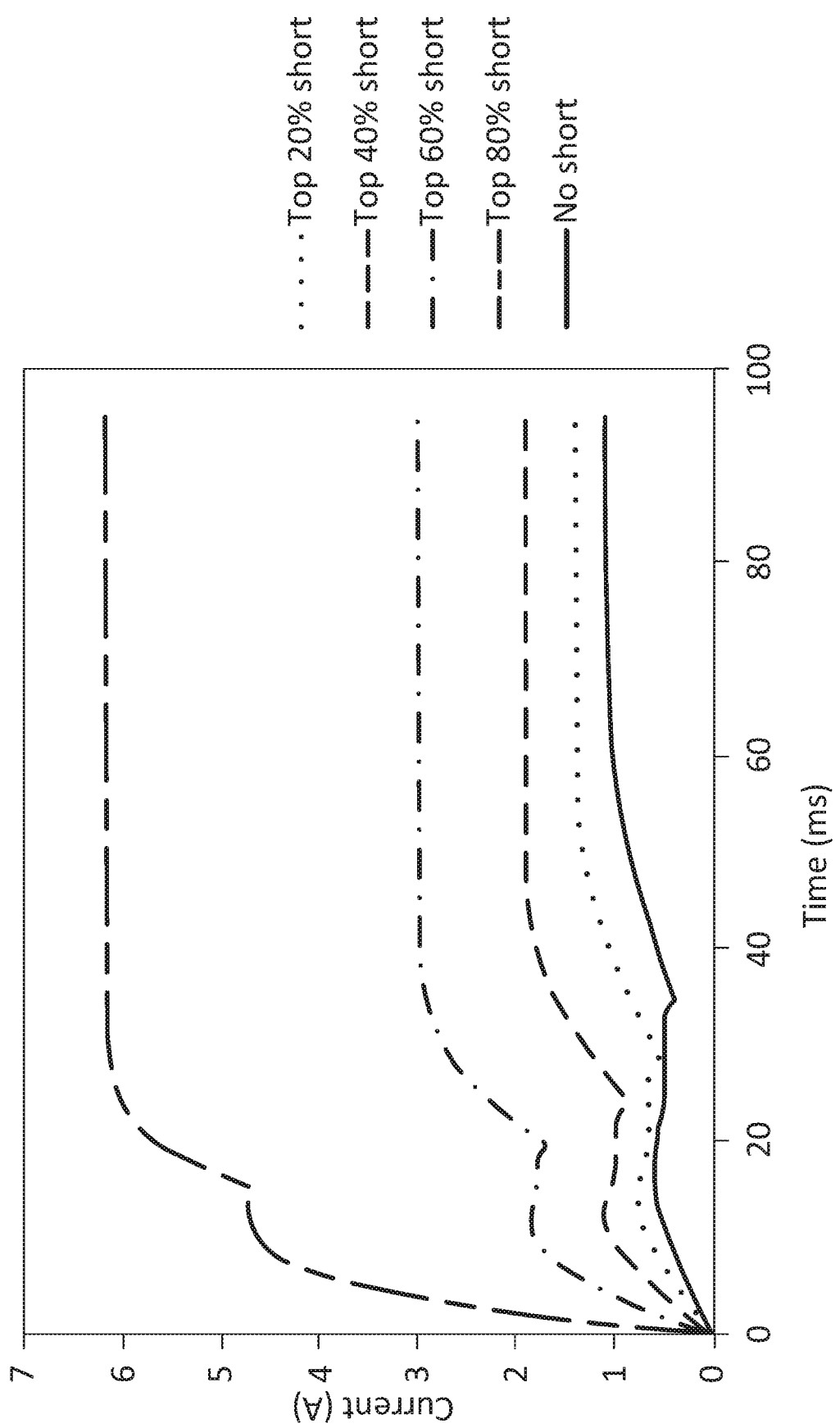
FIG. 5 is a plot illustrating current signature variation due to integrity of the solenoid coil.

FIG. 5 is a plot illustrating current signature variation due to integrity of the solenoid coil for cases where it is known that there is no spool default condition. Over time, due to vibration, environmental exposure, or other causes, the insulating material between successive turns of the solenoid coil wear and some of the turns of the coil can short, resulting in a reduction in the impedance of the coil. FIG. 5 shows the variation in current signature from multiple percentages of the turns in the solenoid coil being shorted, e.g. multiple coil impedance levels.

Figure 6:
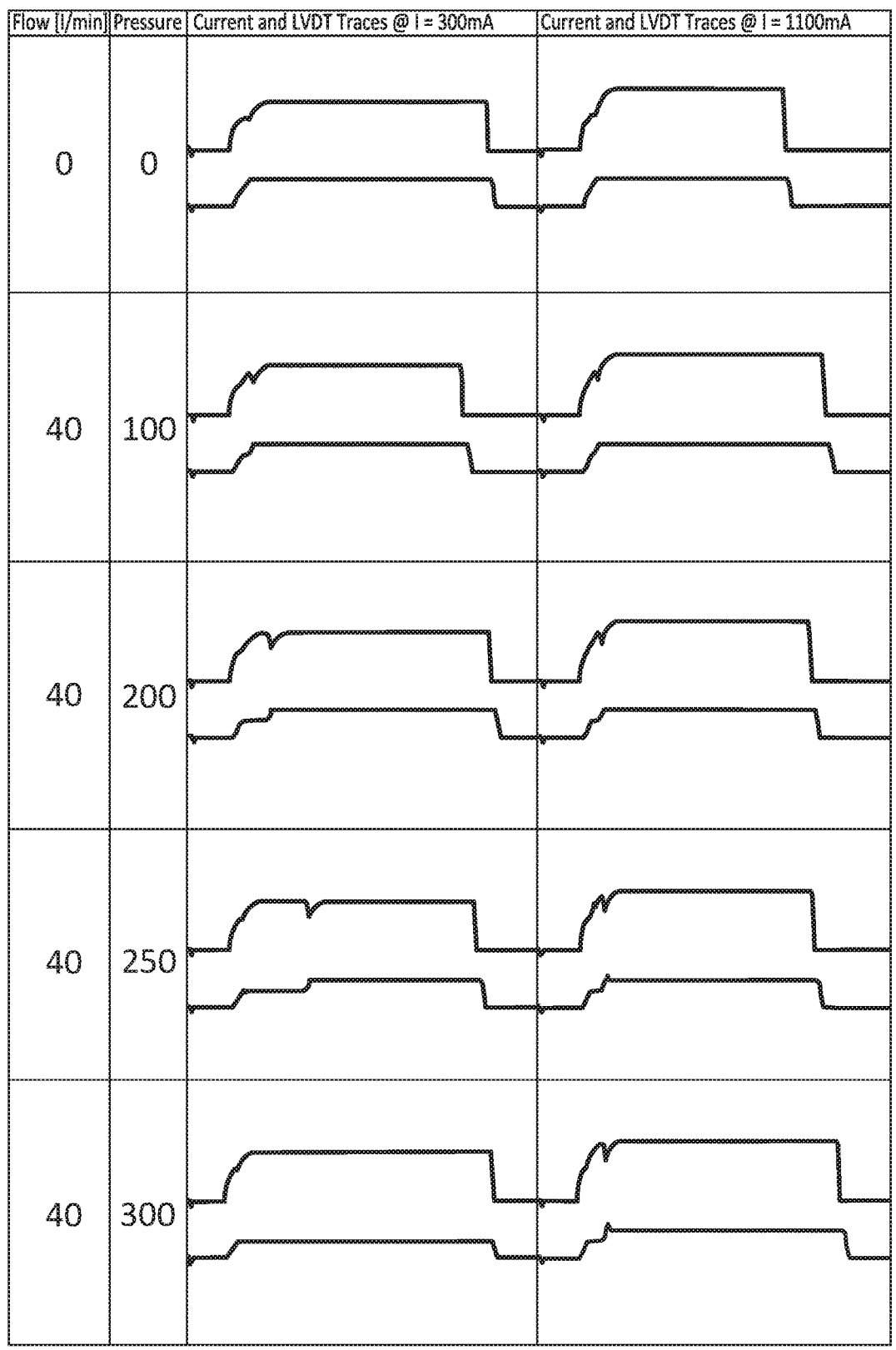
FIG. 6 is a series of plots illustrating current signature variation as a function of different flow and pressure conditions in a valve.

FIG. 6 is a series of plots illustrating current signature variation as a function of different flow and pressure conditions in a valve for cases where it is known that there is no spool default condition. FIG. 6 shows two columns at the left indicating the flow and pressure conditions, respectively, for that row, and the two columns at the right show plots of the current signature at those conditions for coil currents of 900 mA and 1100 mA, respectively, where those two currents were controlled using constant voltage. In each of the ten individual plots shown, the top trace is the current signature, and the bottom trace is the spool position as measured by an LVDT. FIG. 6 illustrates that there is a shift in the peak and valley points of the current signature as pressure increases.

FIGS. 3-6 show that a current signature may change due to other causes besides a spool fault, such as variation in input voltage, temperature, the integrity of the coils of the solenoid, and flow and pressure conditions, and therefore certain spool fault detection methods based on measured current signature, such as threshold based methods, will be inaccurate. However, FIGS. 3-6 also indicate that although the current signature may vary, its shape stays relatively constant when other parameters vary, such input voltage, temperature, the integrity of the coils of the solenoid, and flow and pressure conditions. Therefore, a system and method that relies on inferential sensing, such as measurement of coil or coils 132 current signature, may be used to detect a spool fault condition without the need for direct spool position measurement or additional sensors. Such systems and methods may normalize a measured coil current signature and develop features that are computationally efficient to develop for the detection and do not need additional memory to store historic current signature data, and also may allow for the development of diagnosis or prognosis methods.

Figures 7A, 7B:
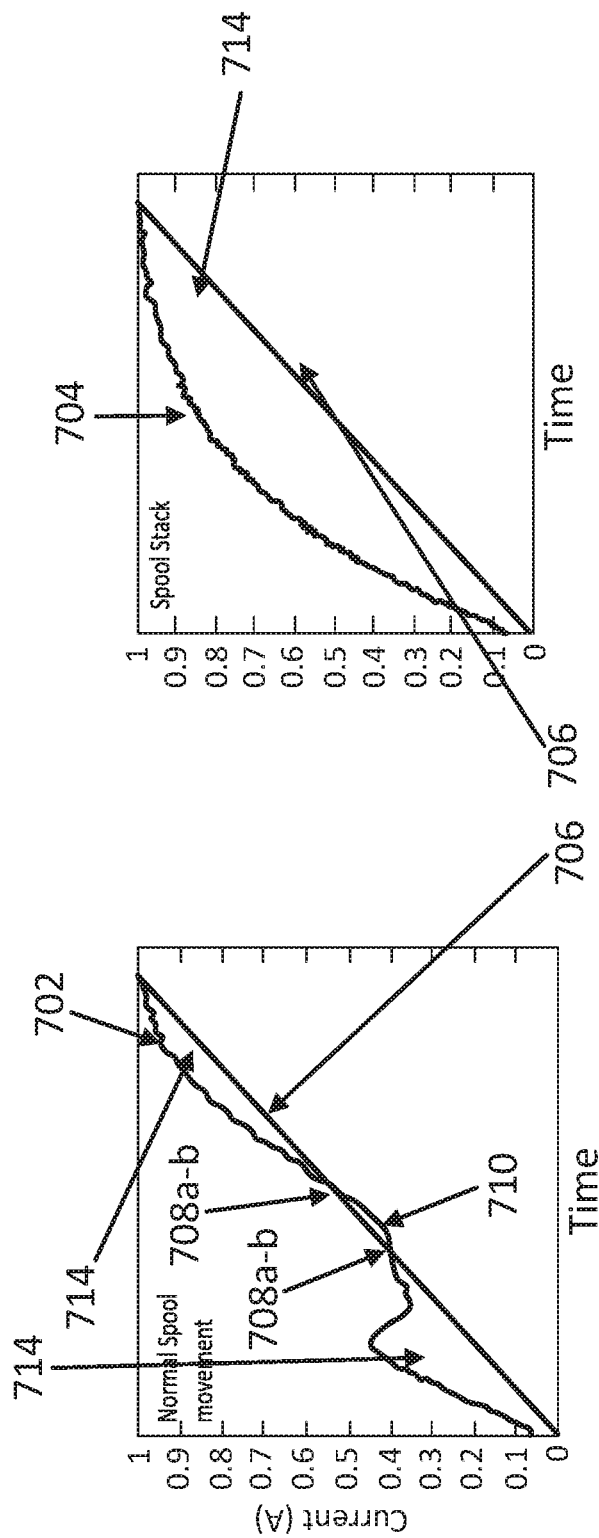
FIGS. 7A and 7B are plots illustrating normalized current signatures of the solenoid coil and a normalized current signature comparator.

FIGS. 7A-7B are plots illustrating normalized current signatures corresponding to negative and positive spool fault conditions, respectively, over-plotted with a current signature comparator. In FIG. 7A, a normalized current signature 702 corresponds to current signature 202 and is normalized to have a magnitude between zero and one. Similarly, in the example shown in FIG. 7B, a normalized current signature 704 corresponds to the current signature 204 and normalized to have a magnitude between zero and one. A normalized current signature comparator 706 may be created that also has a magnitude between zero and one. Normalized current signature comparator 706 is shown as a line in FIGS. 7A and 7B, however, normalized current signature comparator 706 may be a curve, a function, or may be empirically defined. The normalized plots shown in FIGS. 7A and 7B may be divided in a binary grid to develop certain features. These features may contain one or more intersection points 708a-b between normalized current signature 702 and normalized current signature comparator 706, that is, where the normalized current signature 702 and the normalized current signature comparator 706 have an equal value at a particular time. In addition, these features may contain one or more negative areas 710 and one or more positive areas 714. Negative area 710 may be calculated from the difference of the normalized current signature comparator 706 from either the normalized current signature 702 or 704, that is, the normalized current signature comparator 706 may be subtracted from either normalized current signature 702 or 704, and areas corresponding to negative values may be integrated to calculate a negative area 710. In this way, negative area 710 corresponds to areas where either normalized current signature 702 or 704 are less in magnitude than the normalized current signature comparator 706. In the same way, positive area 714 may be calculated from the difference of the normalized current signature comparator 706 from either the normalized current signature 702 or 704. It may be appreciated that the normalization of current signatures or current signature comparators may be between minimum and maximum values other than zero and one, respectively.

A membership function based algorithm may be developed to detect a spool fault condition. The algorithm, which may be a spool fault detection algorithm, may be based on features resulting from the comparison of the normalized current signature comparator 706 and normalized current signatures 702 and 704, such as the intersection points 708a-b, the one or more negative areas 710, the one or more positive areas 714, and the values resulting from functional calculations using such features as functional arguments of a membership function, described below in relation to FIG. 8. The output, or result, of the algorithm may be a positive or negative spool fault condition. In one embodiment, the algorithm may be implemented and/or executed by a processor and a memory in electronic communication with the processor.

Figure 8:
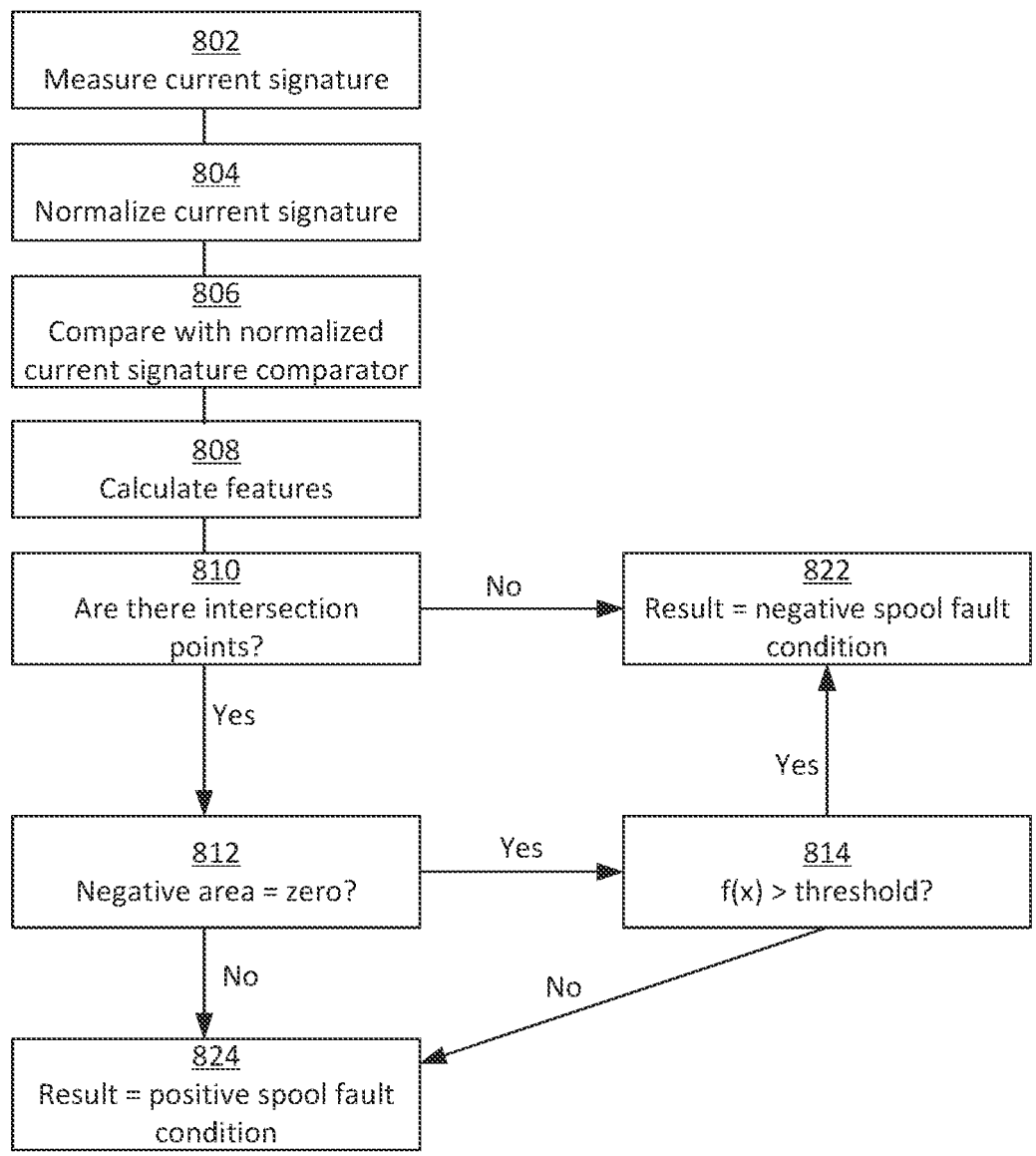
FIG. 8 is a block flow diagram illustrating the steps of an example membership function based algorithm for spool fault detection.
Figure 13:
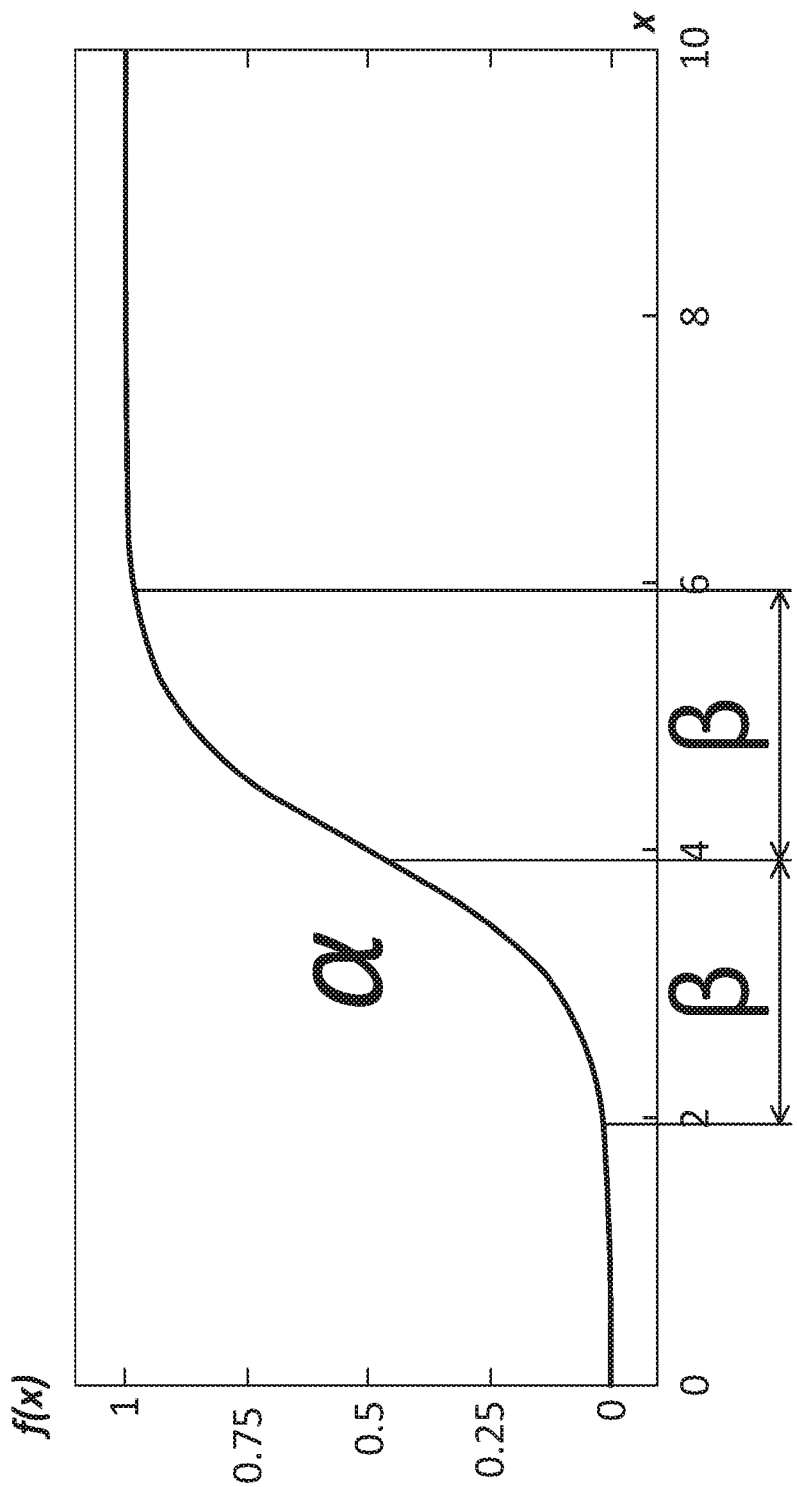
FIG. 13 is an example plot of a sigmoid function f(x).

FIG. 8 is a block flow diagram illustrating the steps of an example membership function based algorithm for spool fault detection. At step 802, the current signature is measured, for example, current signature 202 or 204. At step 804, the measured current signature is normalized, such as, for example, normalized current signatures 702 or 704. At step 806, the normalized current signature is compared with a normalized current signature comparator, such as, for example, normalized current signature comparator 706. At step 808, features are determined based on the comparison at step 806, such features as, and for example, intersection points 708a-b, negative areas 710, and positive areas 714. In addition, at step 808 the value of a membership function may be determined using one of the determined features, for example, negative areas 710 or positive areas 714, as an argument to the function. The value of the membership function can then be used at step 814 below. In some embodiments, and by way of example, a membership function may be a sigmoid function:

$$f(x) = \frac{1}{1 + e^{\frac{-(x-\alpha)}{\beta}}}$$

where $\alpha$ and $\beta$ are constants, and x is the functional argument, e.g. the value of negative areas 710 or positive areas 714. FIG. 13 illustrates a plot of sigmoid function f(x). Steps 810 through 814 are conditionals based on the features and membership function value determined at step 808. At step 810, the algorithm determines whether it was determined at step 808 if any intersection points 708a-b exist. If it was found that intersection points 708a-b do not exist, the algorithm returns a negative spool fault condition 822 indicating that spool 112 is functioning normally. If one or more intersection points 708a-b do exist, the algorithm continues to step 812. At step 812, the algorithm determines whether negative areas 710 are equal to zero, e.g., whether there is no negative area calculated at step 808. If negative areas 710 do not equal zero (e.g. "no" in FIG. 8), the algorithm returns a positive spool fault condition 824 indicating that spool 112 is functioning abnormally. If negative areas 710 are equal to zero, the algorithm continues to step 814.

There are some cases where step 808 will determine that there are no intersection points 708a-b because such intersections may occur at the "corner points" of the normalized current signature and normalized current signature comparator, while at the same time determining the negative area 710 that is non-zero. This may occur because of noise in the current signature 202 or 204 measured by electrical current meter 173 or other causes. If these cases are not accounted for, the algorithm will return a false positive spool fault condition. For this reason, the algorithm may use further determinations, some of which include a membership function to change the sensitivity of determinations based on the features determined in step 808 rather than using those features as determined directly.

Figure 9:
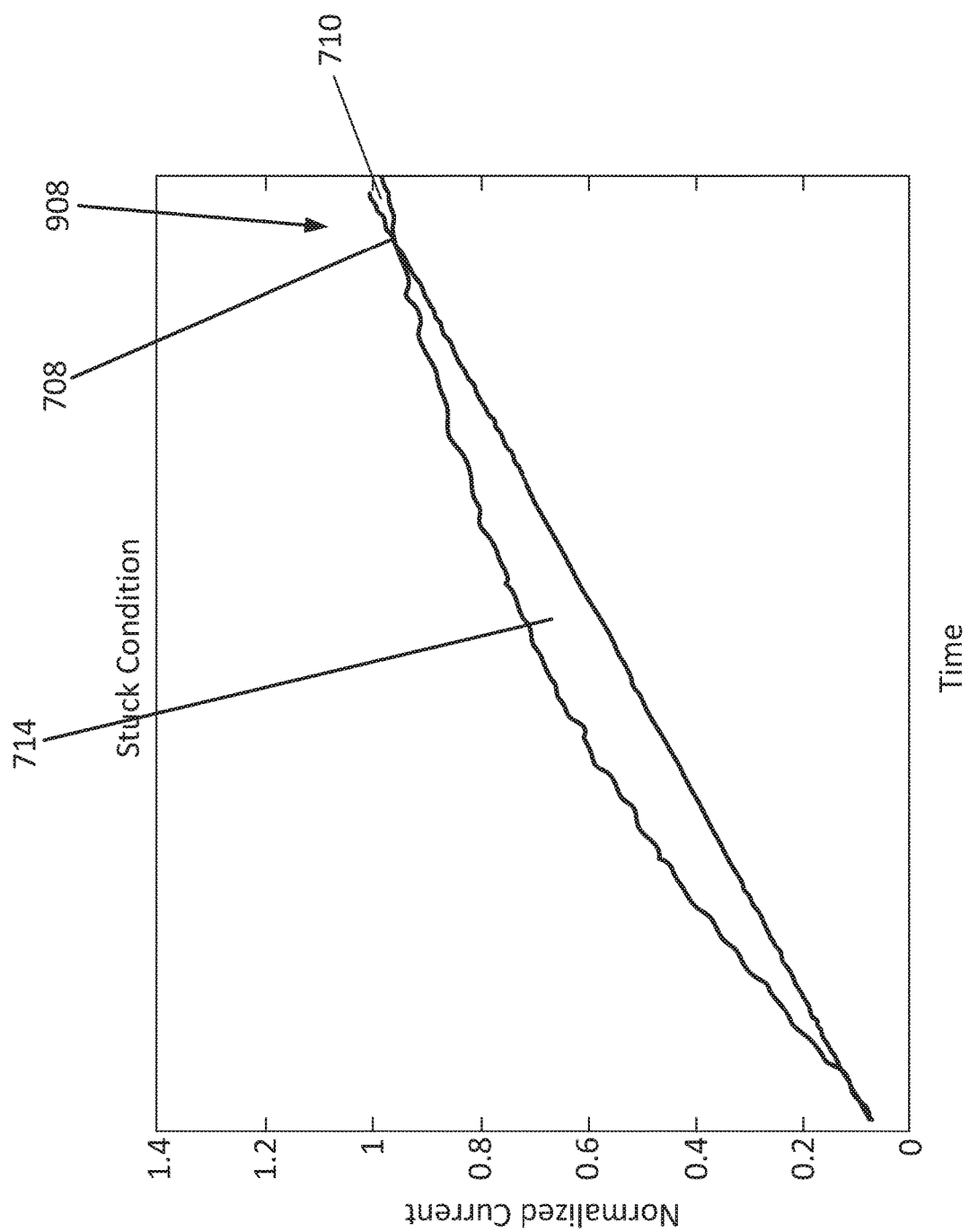
FIG. 9 is a plot that illustrates an intersection occurring at a corner point.

FIG. 9 is a plot that illustrates an intersection occurring at a corner point. FIG. 9 illustrates a case where intersection 708 is not determined to exist at step 808 of the membership function based algorithm because it occurs at corner point 908, while positive area 714 and negative area 710 are determined to exist at step 808 and their areas may be determined at step 808 as well.

Returning now to FIG. 8, at step 814, the value of the membership function, e.g. f(x), determined at step 808 is compared with a threshold value. If the membership function value is greater than the threshold value, the algorithm returns a negative spool fault condition 822 indicating that spool 112 is functioning normally. If the membership function is less than the threshold value, the algorithm returns a positive spool fault condition 824 indicating that spool 112 is functioning abnormally.

An example of a membership function based algorithm, such as that which might be implemented via the steps illustrated in FIG. 8, is included below as pseudocode:

```
If(intersection points 708a-b = yes exist)
        result = negative spool fault condition;
else
      if(negative area 710 = 0)
             result = positive spool fault condition;
      else
//Below logic is added to handle cases where negative area because
// of actual no stuck condition and only corner points intersection
//with ideal line
             y = f(negative area 710);
                 if(y > threshold)
                        result = negative spool fault condition;
                 else
                        result = positive spool fault condition;
                 end
      end
end
function y = f(x)
a1 = –200;
c1 = –0.01;
```

$y$=Cm_sigmf($x,a1,c1$).

In the example pseudocode example above, Cm_sigmf is the membership function, for example, sigmoid function f(x) above. Additionally, a1 and c1 are equivalent $\alpha$ and $\beta$, respectively, as illustrated in FIG. 13. It may be appreciated that while the pseudocode shows a1=–200 and c1=–0.01, other values for a1 and c1 may be used and are within the scope of this disclosure.

In some embodiments, the systems and methods disclosed here for spool fault detection including a membership function based may be implemented in on-board electronics for valves with on-board electronics, or it may be implemented in a device that is separate from the valve assembly 100, for example, as a plug that may be communicatively attached to a communications port of a valve.

When the spool 112 does not move normally, the resulting spool fault condition indicated by the control unit 170 may also indicate how much the spool 112 moved for positive spool fault conditions where the spool 112 moves less than its intended stroke length in response to a control or command signal. For example, the membership function based algorithm may be altered to detect the amount the spool 112 moves based on the current signature measured by electrical current meter 173.

FIGS. 10A-10E are plots illustrating current signatures for various partial spool stroke lengths achieved in response to a control or command signal. FIG. 10A illustrates the current signature for a full stroke length and as such would result in a negative spool fault condition. FIG. 10B illustrates a current signature for a stroke length that was 60% of that which was intended by the input control or command signal and as such would result in a positive spool fault condition, and the spool fault condition may report the fault as a value representing the amount that the spool actually moved in response to the control or command signal, for example, as 60%. FIGS. 10C-10E illustrate similar current signatures for positive spool fault conditions that may report fault values of 40%, 20%, and 100% (e.g., no spool movement), respectively.

Figure 11:
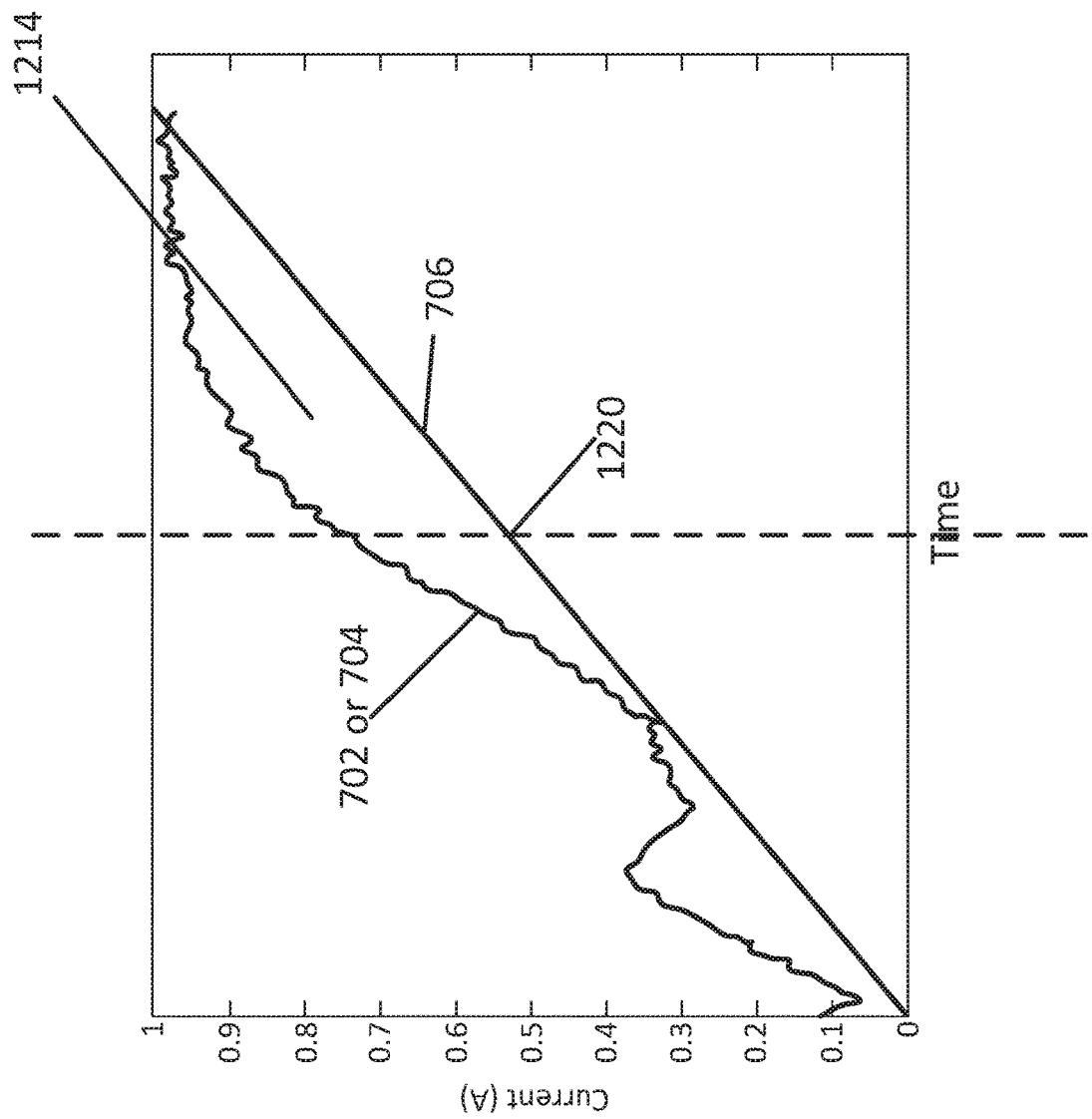
FIG. 11 is a plot illustrating additional features that maybe determined from a comparison of a normalized current signature and a normalized current signature comparator.
Figure 12:
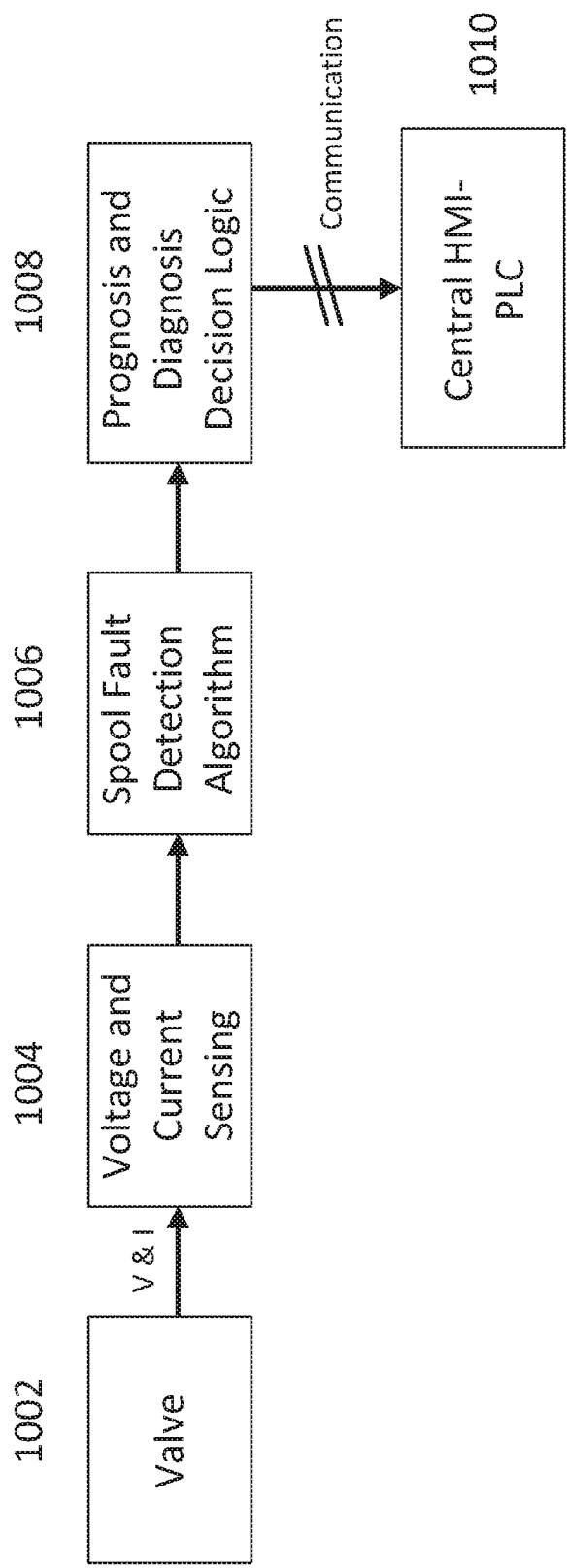
FIG. 12 is a block diagram illustrating an example embodiment of a method for monitoring a valve for spool fault conditions.

FIG. 11 is a plot illustrating additional features that maybe determined from a comparison of a normalized current signature and a normalized current signature comparator. Such features may be one or more modified positive areas 1214, which are positive areas similar to positive areas 714 but only occur for values greater than the midpoint 1220 of the normalized current signature comparator 706. For example, FIG. 12 shows modified positive area 1214 is bounded by the dotted line passing through the midpoint 1220 of the normalized current signature comparator 706, normalized current signature 702 or 704, and the normalized current signature comparator 706. Such features may be used to improve spool fault detection to reduce false positives, to improve spool position detection or stroke length achieved, or for other determinations.

Membership function based algorithm may utilize other features that maybe determined, for example, at step 808. In some embodiments, such features include one or more positive areas 714, or one or more modified positive areas 1214.

Another example of a membership function based algorithm, such as that which might be implemented via the steps illustrated in FIG. 8, is included below as pseudocode:

```
threshold = 0.4;
If(intersection points 708a-b = yes exist)
        result = negative spool fault condition;
else
        y = f(modified positive area 1214);
             if(y >= threshold)
                    result = negative spool fault condition;
             else
                    result = positive spool fault condition;
             end
      end
end
function y = f(x)
a1 = –40;
c1 = 0.05;
```

$y$=Cm_sigmf($x,a1,c1$).

In the pseudocode example just above, Cm_sigmf is the membership function, for example, sigmoid function f(x) above. Additionally, a1 and c1 are equivalent $\alpha$ and $\beta$, respectively, as illustrated in FIG. 13. It may be appreciated that while the pseudocode shows a1=–40, c1=0.05, and threshold=0.4, other values for a1, c1, and the threshold may be used and are within the scope of this disclosure.

FIG. 12 is a block diagram illustrating an example embodiment of a method for monitoring a valve for spool fault conditions. At 1002, a control or command signal is applied to coil 132 of a solenoid operated valve. At 1004, a current signature 202 or 204 are measured. At 1006, a spool fault detection method, such as, for example, the membership function based algorithm described above in relation to FIGS. 8 and 9, is executed. At 1008, further prognosis and diagnosis may occur using other parameters of valve assembly 100 independently or in combination with the spool fault detection method of 506. At 1010, results are communicated to a central HMI-PLC.

It may be appreciated that in general, the negative or positive fault conditions may be binary values such as "0" or "1," numeric values, text, or signals such as electronic signals.

The various embodiments described above are provided by way of illustration only and should not be construed to limit the claims attached hereto. Those skilled in the art will readily recognize various modifications and changes that may be made without following the example embodiments and applications illustrated and described herein, and without departing from the true spirit and scope of the following claims.

Although the present disclosure has been described with reference to particular means, materials and embodiments, from the foregoing description, one skilled in the art can easily ascertain the essential characteristics of the present disclosure and various changes and modifications may be made to adapt the various uses and characteristics without departing from the spirit and scope of the present invention as set forth in the following claims.

What is claimed is:

1. A system for monitoring the spool of a solenoid operated valve comprising:
    a solenoid operated valve comprising at least one coil and at least one spool;
    an electrical current meter to measure a current signature of the coil during actuation of the solenoid operated valve; and
    a processor and a memory in electronic communication with the processor for executing a spool fault detection algorithm operable to:
        determine a normalized current signature from the current signature measured by the electrical current meter;
        create a normalized current signature comparator that is independent of the measured current signature;
        compare the normalized current signature and the normalized current signature comparator to determine a spool fault condition including determining whether at least one intersection point between the normalized current signature and the normalized current signature comparator exists; and
        return a spool fault condition.

2. The system of claim 1, wherein the spool fault condition is negative if it is determined that the at least one intersection point exists.

3. The system of claim 1, wherein the comparison of the normalized current signature and the normalized current signature comparator to determine a spool fault condition further comprises:
    determining at least one negative area from the difference of the normalized current signature comparator from the normalized current signature;
    determining at least one positive area from the difference of the normalized current signature comparator from the normalized current signature;
    determining a midpoint of the normalized current signature comparator;
    determining at least one modified positive area from the difference of the normalized current signature comparator from the normalized current signature for the portion of the comparison that is greater than the midpoint of the normalized current signature comparator.

4. The system of claim 3, wherein the spool fault condition is positive if it is determined that the at least one intersection point does not exist and the at least one negative area is zero.

5. The system of claim 3, wherein the comparison of the normalized current signature and the normalized current signature comparator to determine a spool fault condition further comprises:
    determining the value of a membership function based on the at least one negative area; and
    determining if the value of the membership function is greater or less than a threshold value.

6. The system of claim 5, wherein the spool fault condition is negative if it is determined that the at least one intersection point does not exist and the at least one negative area is not zero and the value of the membership function is greater than the threshold value.

7. The system of claim 5, wherein the spool fault condition is positive if it is determined that the at least one intersection point does not exist and the at least one negative area is not zero and the value of the membership function is less than the threshold value.

8. The system of claim 5, wherein the membership function comprises a sigmoid function.

9. The system of claim 5, wherein the spool fault condition is a not reduced spool stroke condition if it is determined that the at least one intersection point does not exist and the at least one negative area is not zero and the value of the membership function is greater than the threshold value.

10. The system of claim 5, wherein the spool fault condition is a reduced spool stroke condition if it is determined that the at least one intersection point does not exist and the at least one negative area is not zero and the value of the membership function is less than the threshold value.

11. The system of claim 3, wherein the spool fault condition is a reduced spool stroke condition if it is determined that the at least one intersection point does not exist and the at least one negative area is zero.

12. The system of claim 1, wherein the spool fault condition is a not reduced spool stroke condition if it is determined that the at least one intersection point exists.

13. The system of claim 1, wherein the electrical current meter, the processor, and the memory in electronic communication with the processor comprise a device separate from the solenoid operated valve.

14. A method of detecting a solenoid valve spool fault, comprising:
    measuring a current signature of a solenoid coil upon actuating a solenoid valve;
    determining a normalized current signature from the measured current signature;
    creating a normalized current signature comparator that is independent of the measured current signature;
    determining whether at least one intersection point between the normalized current signature and the normalized current signature comparator exists;
    determining at least one negative area from the difference of the normalized current signature comparator from the normalized current signature;
    determining a value of a membership function based on the at least one negative area; and
    determining a spool fault condition based on whether the at least one intersection point exists, the at least one negative area, and the value of the membership function.

15. The method of claim 14, wherein the spool fault condition is negative if the at least one intersection point exists;

the spool fault condition is positive if the at least one intersection point does not exist and the at least one negative area is zero;

the spool fault condition is negative if the at least one intersection point does not exist, the at least one negative area is not zero, and the value of the membership function is greater than a threshold value; and the spool fault condition is positive if the at least one intersection point does not exist, the at least one negative area is not zero, and the value of the membership function is less than a threshold value.

16. The method of claim 14, wherein the membership function comprises a sigmoid function.

17. The method of claim 14, wherein the spool fault condition is a not reduced spool stroke condition if the at least one intersection point exists;

the spool fault condition is a reduced spool stroke condition if the at least one intersection point does not exist and the at least one negative area is zero;

the spool fault condition is a not reduced spool stroke condition if the at least one intersection point does not exist, the at least one negative area is not zero, and the value of the membership function is greater than a threshold value; and the spool fault condition is a reduced spool stroke condition if the at least one intersection point does not exist, the at least one negative area is not zero, and the value of the membership function is less than a threshold value.

18. A system for monitoring a solenoid operated valve including at least one coil and at least one spool, the system comprising:

an electrical current meter to measure a current signature of the coil upon actuating the solenoid operated valve; and a processor and a memory in electronic communication with the processor for executing a spool fault detection algorithm operable to:

compare a normalized current signature from the current signature measured by the electrical current meter to a created normalized current signature comparator determine an operating condition of the solenoid operated valve, the created normalized current signature comparator independent of the measured current signature.

* * * * *